US012771370B2

(12) United States Patent
Martens et al.

(10) Patent No.: US 12,771,370 B2
(45) Date of Patent: Oct. 20, 2026

(54) SIGNAL SAMPLING CIRCUITRY AND A METHOD FOR SIGNAL SAMPLING AND HOLDING

(71) Applicant: IMEC VZW, Leuven (BE)

(72) Inventors: Ewout Martens, Heverlee (BE); Anirudh Praveen Kankuppe Raghavendra Swamy, Leuven (BE); Angelo Parisi, Leuven (BE)

(73) Assignee: Imec vzw, Leuven (BE)

( * ) Notice: Subject to any disclaimer, the term of this patent is extended or adjusted under 35 U.S.C. 154(b) by 65 days.

(21) Appl. No.: 18/904,738

(22) Filed: Oct. 2, 2024

(65) Prior Publication Data

US 2025/0119153 A1 Apr. 10, 2025

(30) Foreign Application Priority Data

Oct. 4, 2023 (EP) .................................... 23201719

(51) Int. Cl.
*H03M 1/12* (2006.01)
*H03M 1/44* (2006.01)

(52) U.S. Cl.
CPC ......... *H03M 1/1255* (2013.01); *H03M 1/442* (2013.01)

(58) Field of Classification Search
CPC .. H03M 1/1255; H03M 1/442; H03M 1/1245; H03M 1/1215; G11C 27/024
See application file for complete search history.

(56) References Cited

U.S. PATENT DOCUMENTS

| | | | | |
|---|---|---|---|---|
| 5,606,320 | A | 2/1997 | Kleks | |
| 6,384,758 | B1 | 5/2002 | Michalski et al. | |
| 7,279,986 | B2 | 10/2007 | Ali | |
| 8,493,099 | B2 | 7/2013 | Noguchi | |
| 9,356,593 | B2 | 5/2016 | Pan et al. | |
| 10,062,450 | B1 * | 8/2018 | Moore | G11C 27/024 |
| 2019/0173481 | A1 * | 6/2019 | Ali | H03M 1/1225 |

FOREIGN PATENT DOCUMENTS

| | | | |
|---|---|---|---|
| WO | WO2008149255 | * 12/2008 | H03M 1/0678 |
| WO | WO2009090514 | * 7/2009 | H03M 1/1215 |

OTHER PUBLICATIONS

Extended European Search Report for European Patent Application No. 23201719.4, mailed Apr. 10, 2024.

(Continued)

*Primary Examiner* — Jean B Jeanglaude
(74) *Attorney, Agent, or Firm* — McDonnell Boehnen Hulbert & Berghoff LLP

(57) ABSTRACT

A signal sampling circuitry comprises: a plurality of sampling units receiving an input signal for time-interleaved sampling, each sampling unit comprising: a sampling capacitor having a first plate connected to an output of the sampling unit; a first plate switch between the first plate and a first reference voltage, a second plate switch between a second plate of the sampling capacitor and a second reference voltage; an input buffer for outputting a buffered input (Continued)

signal to the second plate; wherein the input buffer is connected to at least one power gating switch for powering down the input buffer.

15 Claims, 5 Drawing Sheets

(56) References Cited

OTHER PUBLICATIONS

Di Pasquo, et al., "A High Linearity Driver with Embedded Interleaved Track-and-Hold Array for High-Speed ADC," International Symposium on Circuits and Systems (ISCAS), IEEE, May 22, 2021, pp. 1-5. DOI: 10.1109/ISCAS51556.2021.9401618.
Ensafdaran, et al., "Switched Current Integrating Sampler for Time Interleaved ADCs," IEEE Transactions on Circuits and Systems—I: Regular Papers, vol. 61, No. 1, Jan. 2014.
Chung, et al., "A 38-mW 7-bit 5-GS/s Time-Interleaved SAR ADC with Background Skew Calibration," IEEE Asian Solid-State Circuits Conference, Nov. 5-7, 2018, Tainan, Taiwan.
Hershberg, et al., "A 3.2GS/s 10 ENOB 61mW Ringamp ADC in 16nm with Background Monitoring of Distortion," IEEE International Solid-State Circuits Conference 2019, Session 3, Nyquist Rate ADCs, 3.1 (3 pages).
Ali, et al., "A 12-b 18-GS/s RF Sampling ADC With an Integrated Wideband Track-and-Hold Amplifier and Background Calibration," IEEE Journal of Solid-State Circuits, vol. 55, No. 12, Dec. 2020, pp. 3210-3224.
Ma, et al., "A 32.5-GS/s Sampler With Time-Interleaved Track-and-Hold Amplifier in 65-nm CMOS," IEEE Transactions on Microwave Theory and Techniques, vol. 62, No. 12, Dec. 2014, pp. 3500-3511.
Zhen, et al., "A 35-GHz Bandwidth 30 GSa/s InP Track-and-Hold Amplifier Using Enhanced fT-Doubler Technique," IEEE Transactions on Circuits and Systems—II: Express Briefs, vol. 69, No. 11, Nov. 2022, pp. 4243-4247.
Straayer, et al., "A 4GS/s Time-Interleaved RF ADC in 65nm CMOS with 4GHz Input Bandwidth," IEEE International Solid-State Circuits Conference 2019, Session 27, Hybrid and Nyquist Data Converters, 27.5 (3 pages).
Im, et al., "A 112-GB/s PAM-4 Long-Reach Wireline Transceiver Using a 36-Way time-Interleaved SAR ADC and Inverter-Based RX Analog Front-End in 7-nm FinFET," IEEE Journal of Solid-State Circuits, vol. 56, No. 1, Jan. 2021, 12 pages.

* cited by examiner

SIGNAL SAMPLING CIRCUITRY AND A METHOD FOR SIGNAL SAMPLING AND HOLDING

CROSS-REFERENCE TO RELATED APPLICATIONS

The present application is a non-provisional patent application claiming priority to European Patent Application No. EP 23201719.4, filed Oct. 4, 2023, the contents of which are hereby incorporated by reference.

FIELD OF THE DISCLOSURE

The present description relates to a signal sampling circuitry and a method for signal sampling and holding. In particular, the present description relates to time-interleaved sampling.

BACKGROUND

Analog-to-digital converters (ADCs) are commonly used for allowing digital processing of analog signals. In many applications, a very high sampling speed is required in order to allow analog-to-digital conversion of an analog signal with high frequency content into a digital signal.

For high speed sampling, such as sampling speeds in range of GHz, it may not be realistic to use a single sampling unit. Rather, a plurality of sampling units may be used, wherein the sampling units are arranged in parallel and provide samples that are shifted in time in relation to each other such that the plurality of sampling units act in a time-interleaved manner so as to provide an overall high sampling speed.

A sampling circuitry needs to have a high bandwidth in order to enable sampling of an input signal with high frequency content. Thus, there is a need for ensuring a high bandwidth of sampling circuitry. There is also a need for ensuring low power consumption for sampling an input signal.

SUMMARY

The present disclosure relates to sampling of high frequency input signals. The present disclosure provides a sampling circuitry with a high bandwidth. Another objective of the present description is to provide a sampling circuitry with a low power consumption.

In an example embodiment, there is provided a signal sampling circuitry comprising: a plurality of sampling units configured to receive an input signal for time-interleaved sampling, wherein each sampling unit of the plurality of sampling units comprises: a sampling capacitor having a first plate and a second plate, wherein the first plate is connected to an output of the sampling unit; a first plate switch arranged between the first plate of the sampling capacitor and a first reference voltage, wherein the first plate switch is configured to receive a first clock signal at a gate of the first plate switch for controlling the first plate switch between an active state and an inactive state; a second plate switch arranged between the second plate of the sampling capacitor and a second reference voltage, wherein the second plate switch is configured to receive a second clock signal at a gate of the second plate switch for controlling the second plate switch between an active state and an inactive state; an input buffer configured to receive the input signal and configured to output a buffered input signal at an output node, wherein the output node of the input buffer is connected to the second plate of the sampling capacitor; wherein the input buffer is connected to at least one power gating switch for powering down the input buffer.

The input signal received by the signal sampling circuitry is distributed to the plurality of sampling units such that the input signal is received by each sampling unit. Each sampling unit of the sampling circuitry comprises an input buffer. This implies that the resistance and capacitance of a network for distributing the input signal to the sampling unit does not affect the sampling bandwidth. Thus, the use of a plurality of input buffers (each sampling unit comprising an input buffer) may ensure that a high bandwidth of the sampling circuitry is provided. Each input buffer can be much smaller than a single buffer should be to drive the plurality of sampling units.

Due to the at least one power gating switch, a signal at the second plate of the sampling capacitor may be controlled while the input buffer may also be powered down when the sampling unit is not used for sampling. Thus, the sampling circuitry may provide a low power consumption. Also, a resistance of the power gating switch does not affect sampling bandwidth.

The input signal is an analog signal. The input signal may for instance be a signal produced by a sensor, but it should be realized that the input signal may be any kind of analog signal.

The plurality of sampling units is configured to perform time-interleaved sampling. This implies that different sampling units of the plurality of sampling units provide sampling at different time instances and successively in time such that the plurality of sampling units may provide an overall high sampling rate while each individual sampling unit has a relatively low sampling rate.

The sampling unit may provide a sampled output signal at the output of the sampling unit. The sampling unit may be configured to hold the sampled output signal at the output. The sampling unit may be configured to form a sample-and-hold unit.

The sampling unit may further be connected to an analog-to-digital converter (ADC). The ADC may be connected to the output of the sampling unit for receiving the sampled value and may be configured to convert the sampled value to a digital representation. Each sampling unit may be connected to a respective ADC.

The first reference voltage and the second reference voltage may each be provided by a fixed voltage available to the signal sampling circuitry. The first reference voltage is different from the second reference voltage.

For instance, the first reference voltage may be a lower voltage level supplied to the sampling circuitry, such as a ground voltage, and the second reference voltage may be a higher voltage level supplied to the sampling circuitry, such as a voltage based on a supply voltage of the circuitry. However, it should be realized that the first reference voltage may instead be based on the supply voltage and the second reference voltage may be a ground voltage.

Switches may be provided as transistor switches. Thus, the switches may each be formed by a transistor, comprising a source, drain and a gate. The switch may be configured to receive a signal at the gate for controlling whether a channel is opened or closed between the source and the drain. Thus, the transistor may operate as a switch and may be controlled by a signal at the gate. It should be realized that a switch may further be formed by more than one transistor, such as using a p-type metal-oxide-semiconductor (PMOS) transistor and a n-type metal-oxide-semiconductor (NMOS) transistor, wherein the NMOS transistor may be configured to receive the first clock signal at a gate of the NMOS transistor and the PMOS transistor may be configured to receive the inverse of the first clock signal at a gate of the PMOS transistor.

The term "first plate switch" is used herein to denote a switch that is connected to the first plate of the sampling capacitor. The first plate switch may thus control a connection between the first plate of the sampling capacitor and the first reference voltage to be opened or closed. The first plate switch may thus provide that the connection between the first plate of the sampling capacitor and the first reference voltage is closed in the active state of the first plate switch and the first plate switch may provide that the connection between the first plate of the sampling capacitor and the first reference voltage is opened in the inactive state of the first plate switch.

The term "second plate switch" is used herein to denote a switch that is connected to the second plate of the sampling capacitor. The second plate switch may thus control a connection between the second plate of the sampling capacitor and the second reference voltage to be opened or closed. The second plate switch may thus provide that the connection between the second plate of the sampling capacitor and second reference voltage is closed in the active state of the second plate switch and the second plate switch may provide that the connection between the second plate of the sampling capacitor and the second reference voltage is opened in the inactive state of the second plate switch.

The input buffer is a buffer amplifier that provides electrical impedance transformation from input of the input buffer to the output of the input buffer. The input buffer may provide unity gain such that a signal level is not changed between input and output of the input buffer. The input buffer may be a voltage buffer amplifier.

According to an embodiment, the at least one power gating switch comprises an interrupt switch arranged between a connection to a low voltage level and a connection to a high voltage level of the input buffer, wherein the interrupt switch is configured to receive the second clock signal at a gate of the interrupt switch for controlling the interrupt switch between an active state and an inactive state.

Thus, the input buffer may be connected to a low voltage level, such as ground voltage, and a high voltage level, such as supply voltage of the circuitry. The interrupt switch may be configured to interrupt a path from supply voltage to ground such that the interrupt switch may be used for powering down the input buffer. The low voltage level is referred to as being low in comparison to the high voltage level, such that the low voltage level is lower than the high voltage level.

The interrupt switch may be placed anywhere in the path from the low voltage level to the high voltage level related to the input buffer. The interrupt switch could thus be arranged between the input buffer and a connection to the high voltage level or between the input buffer and a connection to the low voltage level.

The signal sampling circuitry may comprise a single interrupt switch. This implies that the signal sampling circuitry may be controlled using only the first and second clock signals. For high operation, the clock signals need to be high frequency signals providing steep edges for properly controlling the sampling units. Thus, processing for generating the clock signals may require high power consumption. Hence, by ensuring that only the first and second clock signals need to be generated, a low power consumption is ensured.

The output of the input buffer is connected to the second plate. The second plate switch may further ensure that nodes of the input buffer are pulled up to the second reference voltage, which may correspond to the high voltage level. This implies that the single interrupt switch may be arranged between the input buffer and the connection to the low voltage level while still ensuring that the input buffer may be powered down. Correspondingly, if the second reference voltage corresponds to the low voltage level, the single interrupt switch may be arranged between the input buffer and the connection to the high voltage level.

According to an embodiment, the interrupt switch is a first interrupt switch arranged between the input buffer and the low voltage level and wherein the at least one power gating switch further comprises a second interrupt switch arranged between the input buffer and the high voltage level, wherein the second interrupt switch is configured to receive a third clock signal at a gate of the second interrupt switch for controlling the second interrupt switch between an active state and an inactive state, wherein the third clock signal is an inverse of the second clock signal.

Thus, the signal sampling circuitry may comprise two interrupt switches. The two interrupt switches may be used for ensuring that the input buffer is powered down. However, the two interrupt switches may require the third clock signal to be provided requiring additional power consumption for generating the third clock signal.

According to another embodiment, the input buffer comprises a bias transistor for providing a bias signal of the input buffer, wherein the at least one power gating switch comprises a bias switch connected to a gate of the bias transistor, wherein the bias switch is configured to selectively connect a control voltage of the bias transistor to a bias voltage or a fixed reference voltage corresponding to an active and an inactive state of the input buffer, respectively.

The input buffer may thus be provided with a bias signal and the input buffer may be powered down by disabling the bias switch. Thus, the at least one power gating switch may be implemented by a bias switch, which may be configured to power down the input buffer by disabling a connection to the gate of the bias transistor.

According to an embodiment, the input signal is a differential input signal comprising a positive input signal and a negative input signal, and wherein, for each sampling unit, the sampling capacitor is a first sampling capacitor, the first plate switch is connected to a first output of the sampling unit, and the input buffer is a first input buffer, wherein the first input buffer is configured to receive the positive input signal and configured to output a buffered positive input signal at the second plate of the first sampling capacitor, and wherein each sampling unit further comprises: a second sampling capacitor having a third plate and a fourth plate, wherein the third plate is connected to a second output of the sampling unit; a third plate switch arranged between the third plate of the second sampling capacitor and the first reference voltage, wherein the third plate switch is configured to receive the first clock signal at a gate of the third plate switch for controlling the third plate switch between an active state and an inactive state; a fourth plate switch arranged between the fourth plate of the second sampling capacitor and the second reference voltage, wherein the fourth plate switch is configured to receive the second clock signal at a gate of the fourth plate switch for controlling the fourth plate switch between an active state and an inactive state; a second input buffer configured to receive the negative input signal and configured to output a buffered negative input signal at a second output node, wherein the second output node of the second input buffer is connected to the fourth plate of the second sampling capacitor; wherein the first input buffer is connected to the second input buffer via the at least one power gating switch which comprises a shared switch for powering down the first and second input buffers.

This implies that each sampling unit may be adapted for sampling of a differential input signal, providing a positive sampled output signal at the first output of the sampling unit, and providing a negative sampled output signal at the second output of the sampling unit.

The sampling circuitry may comprise a shared switch for powering down the first and second input buffers. This implies that the first and second input buffers may be powered down in a power efficient manner.

Further, use of the shared switch may ensure that any mismatches between two different switches dedicated to each of the first and second input buffers, respectively, are eliminated.

The term "third plate switch" is used herein to denote a switch that is connected to the third plate belonging to the second sampling capacitor. The third plate switch may thus control a connection between the third plate of the second sampling capacitor and the first reference voltage to be opened or closed. The third plate switch may thus provide that the connection between the third plate of the second sampling capacitor and the first reference voltage is closed in the active state of the third plate switch and the third plate switch may provide that the connection between the third plate of the second sampling capacitor and the first reference voltage is opened in the inactive state of the third plate switch.

The term "fourth plate switch" is used herein to denote a switch that is connected to the fourth plate belonging to the second sampling capacitor. The fourth plate switch may thus control a connection between the fourth plate of the second sampling capacitor and the second reference voltage to be opened or closed. The fourth plate switch may thus provide that the connection between the fourth plate of the second sampling capacitor and the second reference voltage is closed in the active state of the fourth plate switch and the fourth plate switch may provide that the connection between the fourth plate of the second sampling capacitor and the second reference voltage is opened in the inactive state of the fourth plate switch.

According to an embodiment, a ground connection of the first input buffer is connected to a ground connection of the second input buffer, wherein the shared switch is arranged between ground and the first and second input buffers.

The interrupt switch may be configured to interrupt a path from supply voltage to ground such that the interrupt switch may be used for powering down the first and the second input buffers.

The output of the first and second input buffers are connected to the second plate of the first sampling capacitor and the fourth plate of the second sampling capacitor, respectively. The second and fourth plate switches may further ensure that nodes of the input buffers are pulled up to the second reference voltage, which may correspond to the high voltage level, and which ensures that the input buffers are completely disabled. This implies that a single shared switch may be arranged between the input buffers and a connection to the low voltage level, such as ground, while still ensuring that the input buffers may be powered down. Correspondingly, if the second reference voltage corresponds to the low voltage level, the shared switch may be arranged between the input buffers and a connection to the high voltage level. According to yet another alternative, the first and second input buffers may share a bias transistor that may be selectively connected to a bias voltage or a fixed reference voltage.

According to an embodiment, each sampling unit further comprises a fifth switch arranged between the second plate of the first sampling capacitor and the fourth plate of the second sampling capacitor, wherein the fifth switch is configured to receive the second clock signal at a gate of the fifth switch for controlling the fifth switch between an active state and an inactive state.

The term "fifth switch" is used herein to denote a switch that is connected to the second plate of the first sampling capacitor and to the fourth plate of the second sampling capacitor.

Additionally or alternatively, each sampling unit further comprises a sixth switch arranged between the first plate of the first sampling capacitor and the third plate of the second sampling capacitor, wherein the sixth switch is configured to receive the first clock signal at a gate of the sixth switch for controlling the sixth switch between an active state and an inactive state.

The term "sixth switch" is used herein to denote a switch that is connected to the first plate of the first sampling capacitor and to the third plate of the second sampling capacitor.

The fifth and sixth switches may be used for reducing a differential resistance of the signal sampling circuitry for a same load of the clock signal. Alternatively, the fifth and sixth switches may be used for reducing load of the clock signal for the same resistance of the signal sampling circuitry.

It should be realized that the signal sampling circuitry may comprise only the fifth switch or only the sixth switch. Alternatively, the signal sampling circuitry may comprise both the fifth switch and the sixth switch.

Using an equal size of the second and fourth plate switches and/or using an equal size of the first and third plate switches may facilitate designing of the size of the switches for controlling resistance of the signal sampling circuitry and/or load of the clock signal.

According to an embodiment, the second and fourth plate switches have an equal size related to a size of the fifth switch.

A relation between the size of the fifth switch and the size of the second and fourth plate switches may be defined in dependence of whether the resistance of the signal sampling circuitry or whether a load of the clock signal is to be controlled. Thus, the size of the fifth switch may be designed to have a desired relation to the size of the second and fourth plate switches.

Additionally or alternatively, the first and third plate switches may have an equal size related to a size of the sixth switch.

A relation between the size of the sixth switch and the size of the first and third plate switches may be defined in dependence of whether the resistance of the signal sampling circuitry or whether a load of the clock signal is to be controlled. Thus, the size of the sixth switch may be designed to have a desired relation to the size of the first and third plate switches.

According to an embodiment, different sampling units are configured to receive different clock signals that are phase-shifted in relation to each other.

This may be used for ensuring that the different sampling units provide sampling at different time instances in a time-interleaved manner.

According to an embodiment, the signal sampling circuitry further comprises a distribution network for distributing the input signal to each of the sampling units.

The distribution network may be formed by passive components, such as simply by wires, for connecting the input signal to each of the sampling units. The distribution network may thus provide passive routing of the input signal to each of the sampling units. However, it should be realized that the distribution network may be more complex and may for instance comprise inductors for increasing a bandwidth of the distribution network.

Due to each of the sampling units comprising an input buffer, resistance and capacitance of the distribution network does not affect sampling bandwidth. Due to downsizing the input buffers within the sampling units compared to a single buffer for driving the plurality of sampling units, the impact on the bandwidth of the distribution network can be small.

According to an embodiment, the first reference voltage is a ground voltage.

This is a suitable manner of implementing the signal sampling circuitry.

According to a second aspect, there is provided a method for signal sampling and holding using a plurality of sampling units for time-interleaved sampling, said method comprising, by each sampling unit of the plurality of sampling units: receiving the input signal at an input buffer; controlling the input buffer to be active; providing a buffered input signal from the input buffer at a second plate of a sampling capacitor; providing a sampled output signal at an output of the sampling unit connected to a first plate of the sampling capacitor, by opening a first plate switch between the first plate of the sampling capacitor and a first reference voltage; thereafter holding the sampled output signal at the output by closing a second plate switch between the second plate of the sample capacitor and a second reference voltage; and powering down the input buffer by controlling at least one power gating switch.

Effects and features of this second aspect are largely analogous to those described above in connection with the first aspect. Embodiments mentioned in relation to the second aspect are largely compatible with the first aspect.

Due to the input signal being buffered by an input buffer at each sampling unit, resistance and capacitance of a network for distributing the input signal to the sampling units does not affect sampling bandwidth. Thus, the method may ensure that a high sampling bandwidth is provided.

The input buffer may be powered down when the sampled output signal is held at the output of the sampling unit. This implies that the method is power efficient.

The at least one power gating switch may be in an active state to control the input buffer to be active. The at least one power gating switch may further be in an inactive state to power down the input buffer.

According to an embodiment, the method further comprises, by each sampling unit of the plurality of sampling units, receiving a first clock signal and a second clock signal for controlling the first plate switch and the second plate switch, wherein different sampling units receive different clock signals that are phase-shifted in relation to each other.

This implies that the phase-shifted clocks may control the sampling units to provide sequential samples of the input signal such that time-interleaved sampling is provided.

The method may comprise controlling the first plate switch based on a first clock signal at a gate of the first plate switch, wherein the first clock signal controls the first plate switch between an active state and an inactive state. The first clock signal may control the first plate switch to be in an inactive state for opening the first plate switch.

The method may further comprise controlling the second plate switch based on a second clock signal at a gate of the second plate switch, wherein the second clock signal controls the first plate switch between an active state and an inactive state. The second clock signal may control the second plate switch to be in an active state for closing the second plate switch whereby the sampled output signal is held at the output of the sampling unit.

The at least one power gating switch may be a single power gating switch. The method may further comprise powering down of the input buffer by controlling the single power gating switch using the second clock signal. Thus, the second clock signal may be used for controlling both the at least one power gating switch and the second plate switch. This implies that power consumption for generating the clock signals is reduced compared to generation of separate clock signals for controlling the power gating switch and the second plate switch.

The input signal may be a differential input signal comprising a positive input signal and a negative input signal. The input buffer of each sampling unit is then a first input buffer, the sampling capacitor of each sampling unit is a first sampling capacitor, and the output of the sampling unit is a first output. The method may then comprise by each sampling unit, receiving the positive input signal at the first input buffer, controlling the first input buffer to be active, providing a buffered positive input signal from the first input buffer at the second plate of the first sampling capacitor, providing a sampled positive output signal at the first output of the sampling capacitor, by opening the first plate switch between the first plate of the first sampling capacitor and the first reference voltage, and thereafter holding the sampled positive output signal at the first output by closing the second plate switch between the second plate of the first sampling capacitor and the second reference voltage. The method may further comprise by each sampling unit, receiving the negative input signal at a second input buffer, controlling the second input buffer to be active, providing a buffered negative input signal from the second input buffer at a fourth plate of a second sampling capacitor, providing a sampled negative output signal at a second output of the second sampling capacitor, by opening a third plate switch between a third plate of the second sampling capacitor and the first reference voltage, and thereafter holding the sampled negative output signal at the second output by closing the fourth plate switch between the fourth plate of the second sampling capacitor and the second reference voltage. The method may further comprise, by each sampling unit, powering down the first and second input buffers by controlling a share switch of the at least one power gating switch.

This implies that the method may be adapted for sampling of a differential input signal. The method may further use a shared switch for powering down the first and second input buffers. This implies that the first and second input buffers may be powered down in a power efficient manner.

BRIEF DESCRIPTION OF THE DRAWINGS

The above, as well as additional objects, features, and advantages of the present description, will be better understood through the following illustrative and non-limiting detailed description, with reference to the appended drawings. In the drawings like reference numerals will be used for like elements unless stated otherwise.

DETAILED DESCRIPTION

Figure 1:
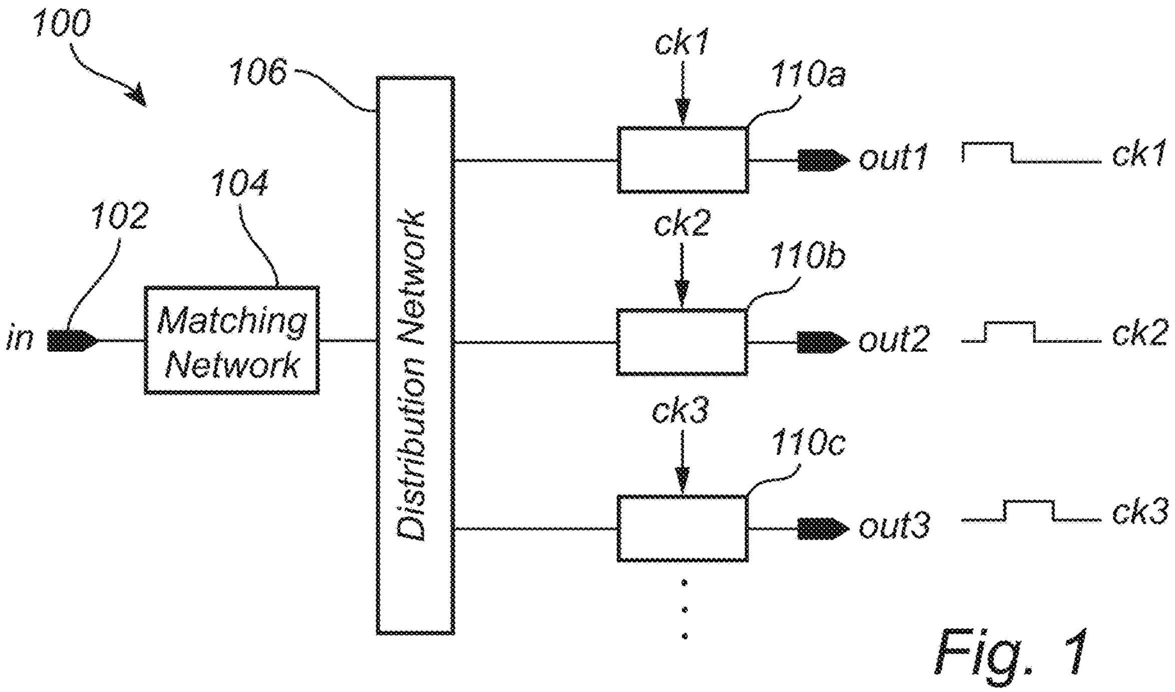
FIG. 1 is a schematic view of a signal sampling circuitry according to an embodiment.

Referring now to FIG. 1, a signal sampling circuitry 100 will be described. The signal sampling circuitry 100 may comprise an input node 102 for receiving an input signal. The input signal may be any analog signal, which is to be sampled in order to generate a digital representation of the analog signal. For instance, the input signal may be a signal from a sensor.

The signal sampling circuitry 100 may comprise a matching network 104 connected to the input node 102. The matching network 104 may be configured to adjust input impedance of the distribution network in combination with the signal sampling circuitry 100 so as to ensure that the input signal is properly transferred from the input node 102 into the signal sampling circuitry 100.

The signal sampling circuitry 100 may further comprise a distribution network 106. The distribution network 106 may be configured to distribute the input signal received at the input node 102 to each of a plurality of sampling units 110*a-c*.

The distribution network 106 may be formed by passive components, such as simply by wires, for connecting the input signal to each of the sampling units 110*a-c*. The distribution network 106 may thus provide passive routing of the input signal to each of the sampling units 110*a-c*. However, it should be realized that the distribution network may be more complex and may for instance comprise inductors for increasing a bandwidth of the distribution network 106.

The signal sampling circuitry 100 uses the plurality of sampling units 110*a-c* such that the sampling units 110*a-c* may sequentially provide samples of the input signal. This implies that each sampling unit 110*a-c* need not have a very high sampling rate, while the plurality of sampling units 110*a-c* may in combination still provide a high sampling rate.

The plurality of sampling units 110*a-c* may thus provide time-interleaved sampling, providing a sequence of samples that comprise a plurality of sub-sequences of samples. Each sub-sequence may comprise one sample from each of the sampling units 110*a-c*, wherein samples from different sampling units 110*a-c* represent the input signal at different time instances. Thus, two samples from a single sampling unit are interleaved by samples from other sampling units.

FIG. 1 illustrates the signal sampling circuitry 100 as having three sampling units 110*a-c*. It should be realized that the number of sampling units may be larger and that a small number of sampling units are shown for simplicity. The number of sampling units may depend on an overall sampling rate that is needed. In some embodiments, the number of sampling units may be at least four or at least eight.

The sampling units 10*a-c* may be controlled to provide sampling at different time instances. The sampling units 110*a-c* may receive clock signals that control timing of sampling at the respective sampling units 110*a-c*. The clock signals may be phase-shifted in relation to each other in order to achieve time-interleaved sampling, as illustrated by clock signals CK1, CK2, CK3 in FIG. 1.

The signal sampling circuitry 100 may be used for sampling of input signals having high frequency content. Thus, the signal sampling circuitry 100 may need a high bandwidth.

If the signal sampling circuitry would comprise a multiple of parallel input buffers between the matching network 104 and the distribution network 106, the bandwidth BW of the signal sampling circuitry could be represented as:

$$BW_{-3dB} = \frac{1}{2\pi}\frac{1}{(R_{in}+R_{dist})\left[C_{in}+C_{dist}+\frac{N_{ov}C_{sample}}{N_{buffers}}+\frac{ILC_{sw}}{N_{buffers}}\right]+R_{sw}C_{sample}},$$

wherein $R_{in}$, is an output impedance of the input buffer, $R_{dist}$ is a resistance of the distribution network from the input buffer to the sampling units, $C_{in}$ is a parasitic capacitance of the input buffer, $C_{dist}$ is a capacitance of the distribution network from the input buffer to the sampling units, $N_{ov}$ is a number of overlapping clock signals for providing time-interleaved sampling by the sampling units, $C_{sample}$ is a capacitance of a sampling capacitor of the respective sampling units, $N_{buffers}$ is a number of parallel input buffers, IL is a number of interleaved sampling units, $C_{sw}$ is a total capacitance of switches of each sampling unit, and $R_{sw}$ is a total resistance of switches of each sampling unit.

The sampling units 110*a-c* according to different embodiments will now be described in larger detail. It should be realized that any of the sampling units described below may be used in the signal sampling circuitry 100 shown in FIG. 1.

Figure 2:
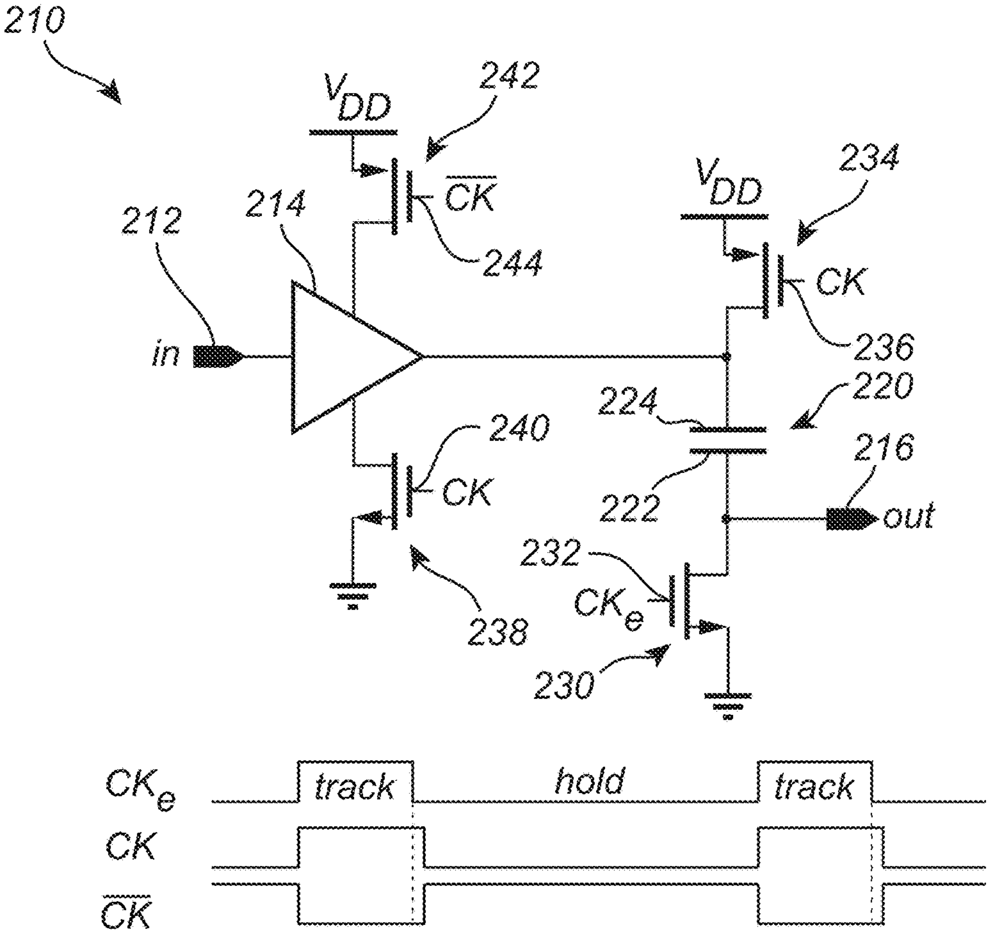
FIG. 2 is a schematic view of a sampling unit according to a first embodiment.

Referring now to FIG. 2, a sampling unit 210 according to a first embodiment will be discussed. A single sampling unit 210 is described and it should be realized that each of a plurality of sampling units may be implemented in the same manner.

The sampling unit 210 comprises an input 212 for receiving the input signal from the distribution network 106. The sampling unit 210 further comprises an input buffer 214 configured to receive the input signal from the input 212.

The signal sampling circuitry 100 thus provides an input buffer 214 in each of the sampling units 210 such that there is no need for an input buffer between the matching network 104 and the distribution network 106. This implies that the resistance and the capacitance of the distribution network 106 may be removed from the above equation defining the bandwidth of the signal sampling circuitry 100, such that the bandwidth is increased. Instead, the distribution network 106 becomes the load of the matching network 104, and the matching network 104 may be easily adjusted accordingly. Furthermore, the number of overlapping clocks $N_{ov}$ in the equation above reduces to one, further improving the sampling bandwidth.

The input buffer 214 is configured to output a buffered input signal at an output node of the input buffer 214. The input buffer 214 may be implemented by a buffer amplifier, which may have unity gain.

The sampling unit 210 further comprises a sampling capacitor 220 having a first plate 222 and a second plate 224.

The first plate 222 is connected to a first reference voltage and the second plate 224 is connected to a second reference voltage. The first reference voltage may be smaller than the second reference voltage. For instance, as shown in FIG. 2, the first reference voltage may be ground voltage, whereas the second reference voltage may be a supply voltage, $V_{DD}$. The first plate 222 may then be referred to as a bottom plate of the sampling capacitor 220 and the second plate 224 may be referred to as a top plate of the sampling capacitor 220. However, it should be realized that the first reference voltage may instead be larger than the second reference voltage.

The second plate 224 of the sampling capacitor 220 is connected to the output node of the input buffer 214. Thus, the sampling capacitor 220 is configured to receive the buffered input signal at the second plate 224 of the sampling capacitor 220.

The first plate 222 of the sampling capacitor 220 is connected to an output 216 of the sampling unit 210. The sampling capacitor 220 may be controlled to provide a sample of the input signal and to hold the sample at the output 216.

The sampling unit 210 comprises a first plate switch 230 and a second plate switch 234 for controlling sampling by the sampling unit 210. The first plate switch 230 is arranged between the first plate 222 of the sampling capacitor 220 and the first reference voltage and the second plate switch 234 is arranged between the second plate 224 of the sampling capacitor 220 and the second reference voltage.

Each of the first plate switch 230 and the second plate switch 234 may be implemented by a transistor operating as a switch, wherein a signal at a gate controls whether a channel between a source and a drain is open or closed for opening or closing the switch.

Thus, the first plate switch 230 comprises a gate 232 and is configured to receive a first clock signal at the gate 232 for controlling the first plate switch 230 between an active state and an inactive state. In the active state, the first plate switch 230 is closed. In the inactive state, the first plate switch 230 is open.

Similarly, the second plate switch 234 comprises a gate 236 and is configured to receive a second clock signal at the gate 236 for controlling the second plate switch 234 between an active state and an inactive state. In the active state, the second plate switch 234 is closed. In the inactive state, the second plate switch 234 is open.

The first plate switch 230 may be implemented by an n-type metal-oxide-semiconductor (NMOS) transistor, as illustrated in FIG. 2. In such case, when the clock signal is high, the switch is in the active state and when the clock signal is low, the switch is in the inactive state. Further, the second plate switch 234 may be implemented by a p-type metal-oxide-semiconductor (PMOS) transistor, as illustrated in FIG. 2. In such case, when the clock signal is low, the switch is in the active state and when the clock signal is high, the switch is in the inactive state.

However, if the first reference voltage is larger than the second reference voltage, the first plate switch 230 may instead be implemented by a PMOS transistor and the second plate switch 234 may be implemented by an NMOS transistor. Each switch may also be implemented by a combination of PMOS and NMOS transistors.

The first clock signal $CK_e$ and the second clock signal CK are illustrated in FIG. 2. The first clock signal $CK_e$ may be called an “early clock” and is almost the same as the second clock signal but changes from a track state to a hold state shortly before the second clock signal. The first and second clock signals may be relatively easy to generate. The second clock signal may be generated based on the first clock signal by providing a short delay of the first clock signal for forming the second clock signal. For high speed clock signals, a common clock signal may be used for creating the first and second clock signals by differently sized drivers. This implies that the first and second clock signals may be generated using a low power consumption.

The input buffer 214 is further connected to two power gating switches, a first interrupt switch 238, and a second interrupt switch 242. The first interrupt switch 238 is arranged between the input buffer 214 and a connection to a low voltage level of the input buffer 214. The second interrupt switch 242 is arranged between the input buffer 214 and a connection to a high voltage level of the input buffer 214. The low voltage level may be ground voltage $V_{SS}$ and the high voltage level may be supply voltage $V_{DD}$.

Each of the first interrupt switch 238 and the second interrupt switch 242 may be implemented by a transistor operating as a switch, wherein a signal at a gate controls whether a channel between a source and a drain is open or closed for opening or closing the switch.

The first interrupt switch 238 comprises a gate 240 and is configured to receive the second clock signal at the gate 240 for controlling the first interrupt switch 238 between an active state and an inactive state. In the active state, the first interrupt switch 238 is closed. In the inactive state, the first interrupt switch 238 is open. The first interrupt switch 238 may be implemented as an NMOS transistor.

The second interrupt switch 242 comprises a gate 244 for controlling the second interrupt switch 242 between an active state and an inactive state. In the active state, the first interrupt switch 242 is closed. In the inactive state, the first interrupt switch 242 is open. The second interrupt switch 242 may be implemented as a PMOS transistor. The second interrupt switch 242 may be configured to receive a third clock signal CK at the gate 244 of the second interrupt switch 242. The third clock signal is an inverse of the clock signal, which means that the first and second interrupt switches 238, 242 are in active state at the same time.

The first and second interrupt switches 238, 242 provide that the input buffer 214 is in a high impedance output state. This corresponds to opening a switch between the input buffer 214 and the second plate 224 of the sampling capacitor 220. Thus, the arrangement of the first and second interrupt switches 238, 242 implies that no sampling switch is needed between the input buffer 214 and the second plate 224 of the sampling capacitor 220.

When the first and second clock signals are high and the third clock signal is low, a signal at the second plate 224 of the sampling capacitor 220 of the sampling unit 210 tracks the input signal while the first plate 222 is kept at the first reference voltage. The first plate switch 230 receiving the first clock signal opens slightly before the first and second interrupt switches 238, 242, when the first clock signal turns low fixing the charge stored in the sampling capacitor 220. This implies that the input signal is sampled onto the sampling capacitor 220. Thereafter, the signal from the input buffer 214 is disconnected from the second plate 224 of the sampling capacitor 220 by the second clock signal and the third clock signal received by the first and second interrupt switches 238, 242 causing the first and second interrupt switches 238, 242 to assume the inactive state. In addition, the second plate switch 234 receiving the second clock signal closes when the second clock signal turns low such that the second plate 224 of the sampling capacitor 220 is pulled to the second reference voltage. Due to charge conservation, this implies that the sampled input signal now appears at the first plate 222 of the sampling capacitor 220 to provide a sampled output signal at the output 216 for analog-to-digital conversion.

The first plate switch 230 may be referred to as a sampling switch and the second plate switch 234 may be referred to as a hold switch.

Each sampling unit 210 may be followed by an analog-to-digital converter (ADC). The ADC may receive the sampled output signal of the sampling unit 210 and may convert the sampled output signal to a digital representation.

The resistance of the first and second interrupt switches 238, 242 does not affect the bandwidth of the signal sampling circuitry 100, due to the arrangement of the first and second interrupt switches 238, 242 between the input buffer 214 and connections to the low and high voltage levels, respectively.

The first and second interrupt switches 238, 242 are connected with sources of the switches 238, 242 connected to a fixed voltage, the low voltage level and the high voltage level, respectively. In addition, the first and second interrupt switches 238, 242 have a maximum drive voltage equal to supply voltage of the circuitry 100. This implies that the first and second interrupt switches 238, 242 may have a small size such that the first and second interrupt switches 238, 242 require low power for driving the switches.

In addition, the arrangement of the first and second interrupt switches 238, 242 in a path from the low voltage level to the high voltage level related to the input buffer 214 implies that the input buffer 214 is powered down when the first and second interrupt switches 238, 242 assume an inactive state and are opened. This implies that power consumption of the sampling unit 210 may be low as the input buffer 214 is powered down when not used.

It should be realized that instead of the first and second interrupt switches 238, 242 in the path from the low voltage level to the high voltage level related to the input buffer 214, the sampling unit may comprise a switch controlling a signal at a gate of a bias transistor of the input buffer. Thus, the input buffer may comprise a bias transistor for providing a bias signal of the input buffer. The at least one power gating switch of the sampling unit may be implemented by a bias switch connected to a gate of the bias transistor.

The bias switch may be implemented by two transistors operating as switches, wherein a signal at each gate of the transistors controls whether a channel between a source and a drain is open or closed for opening or closing the switch.

Thus, the bias switch comprises a gate and is configured to receive the second clock signal at the gate for controlling the bias switch between two states. In the first state, the bias switch brings a bias voltage to the gate of the bias transistor corresponding to the active state of the input buffer. In the second state, the bias switch brings a reference voltage to the gate of the bias transistor that makes the bias transistor inactive corresponding to powering down the input buffer.

Figure 3:
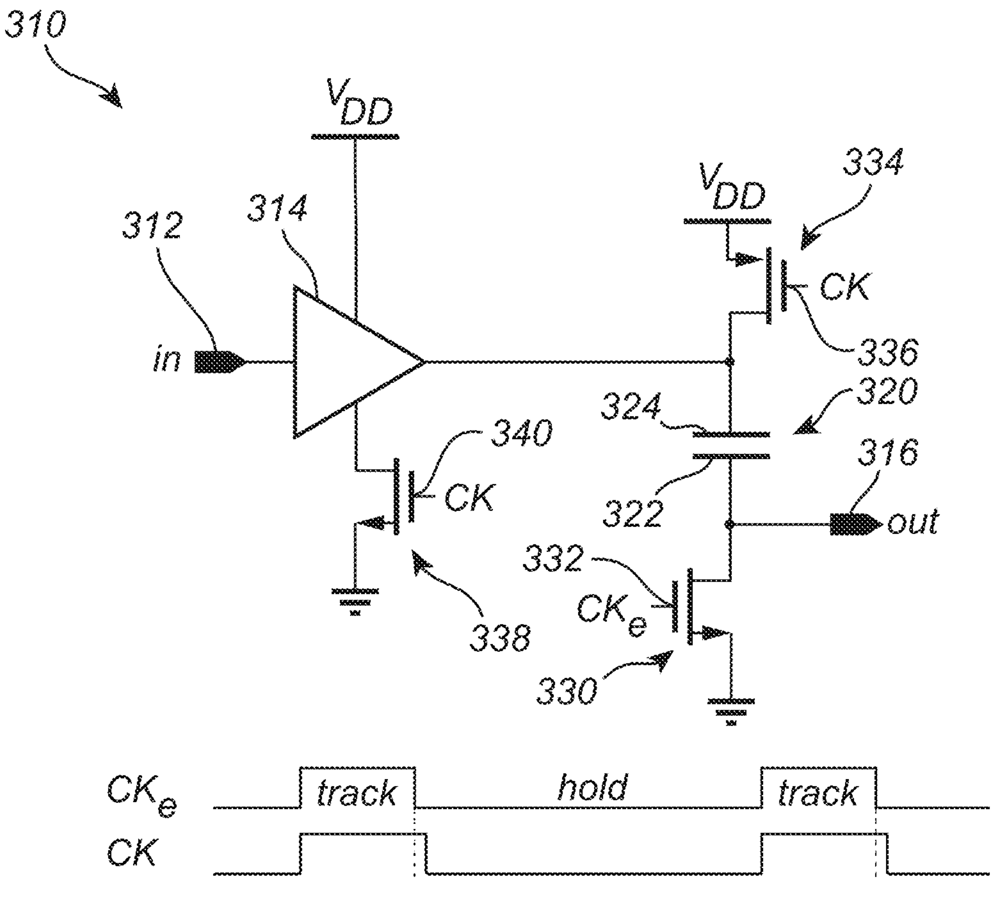
FIG. 3 is a schematic view of a sampling unit according to a second embodiment.

Referring now to FIG. 3, a sampling unit 310 according to a second embodiment will be discussed. A single sampling unit 310 is described and it should be realized that each of a plurality of sampling units may be implemented in the same manner.

The sampling unit 310 is similar to the sampling unit 210 described above. Only differences between the sampling unit 310 and the sampling unit 210 will be described below. Similar to the sampling unit 210, the sampling unit 310 comprises an input 312, an input buffer 314, a sampling capacitor 320 having a first plate 322 and a second plate 324, with the first plate 322 connected to an output 316 of the sampling unit 310. Also, the sampling unit 310 comprises a first plate switch 330 with a gate 332 configured to receive the first clock signal and a second plate switch 334 with a gate 336 configured to receive the second clock signal.

The sampling unit 310 only comprises a single power gating switch connected to the input buffer 314. Thus, the sampling unit 310 comprises an interrupt switch 338 arranged between the input buffer 314 and a connection to the low voltage level of the input buffer 314, such as ground voltage.

The interrupt switch 338 may be implemented by a transistor operating as a switch, wherein a signal at a gate 340 of the interrupt switch 338 controls whether a channel between a source and a drain is open or closed for opening or closing the switch.

The interrupt switch 338 is configured to receive the second clock signal at the gate 340 for controlling the interrupt switch 338 between an active state and an inactive state. In the active state, the interrupt switch 338 is closed. In the inactive state, the interrupt switch 338 is open. The first interrupt switch 338 may be implemented as an NMOS transistor.

When the second clock signal is low, the interrupt switch 338 is open, such that power in the input buffer 314 is cut off via the interrupt switch 338 to the low voltage level. However, compared to the first embodiment, the input buffer 314 is not necessarily in a complete high impedance state, as only a conductive path from the input buffer 314 to the low voltage level is cut off. The input buffer 314 still has a closed conductive path to the high voltage level, such as $V_{DD}$. However, the second plate switch 324 is closed when the second clock signal is low. This implies that the output node of the input buffer 314 is connected to the second reference voltage, such as $V_{DD}$, pulling the output node up to $V_{DD}$. As a result, all nodes of the input buffer 314 are pulled to $V_{DD}$.

This implies that the second interrupt switch 242 of the first embodiment may not be necessary. This further implies that the sampling unit 310 does not need the third clock signal. By eliminating the need for generating the third clock signal, power is saved in clocking generation.

It should be realized that an inverse implementation to the embodiment shown in FIG. 3 is possible. Thus, the input buffer may alternatively comprise a single interrupt switch arranged between the input buffer and a connection to the high voltage level of the input buffer. In addition, the second fixed reference voltage may be a ground voltage so as to instead pull the output node of the input buffer to ground.

Figure 4:
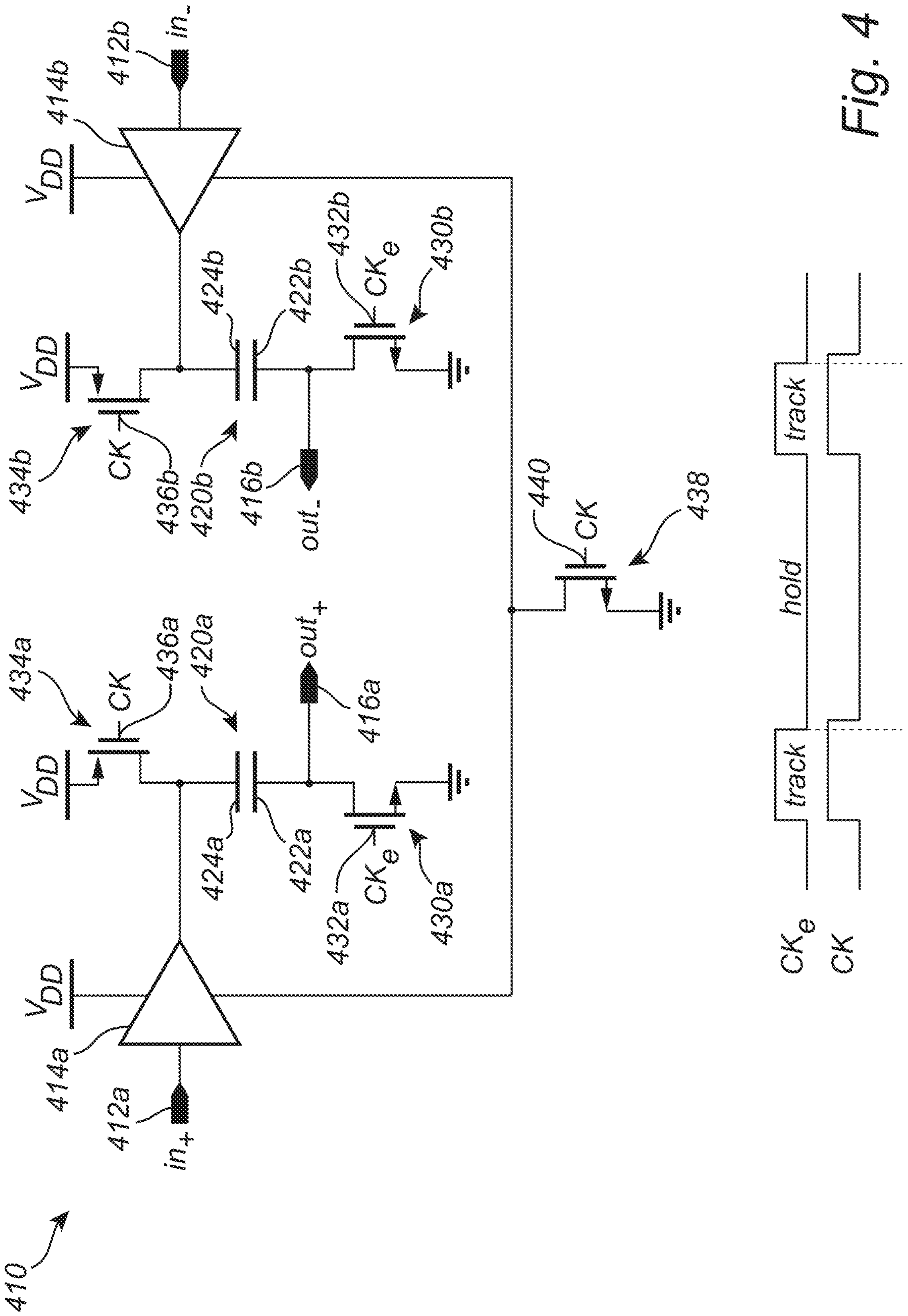
FIG. 4 is a schematic view of a sampling unit according to a third embodiment.

Referring now to FIG. 4, a sampling unit 410 according to a third embodiment will be discussed. A single sampling unit 410 is described and it should be realized that each of a plurality of sampling units may be implemented in the same manner.

The sampling unit 410 is similar to the sampling unit 310 described above. However, the sampling unit 410 is configured to receive a differential input signal comprising a positive input signal and a negative input signal. This implies that the circuitry of the sampling unit 310 is repeated in order to process the positive input signal and the negative input signal.

Thus, the sampling unit 410 comprises a first component configured to sample the positive input signal. The first component comprises a first input 412*a* for receiving the positive input signal, a first input buffer 414*a*, a first sampling capacitor 420*a* having a first plate 422*a* and a second plate 424*a*, with the first plate 422*a* connected to a first output 416*a* of the sampling unit 410. Also, the sampling unit 410 comprises a first plate switch 430*a* with a gate 432*a* configured to receive the first clock signal and a second plate switch 434*a* with a gate 436*a* configured to receive the second clock signal.

Similarly, the sampling unit 410 comprises a second component configured to sample the negative input signal. The second component comprises a second input 412*b* for receiving the negative input signal, a second input buffer 414*b*, a second sampling capacitor 420*b* having a third plate 422*b* and a fourth plate 424*b*, with the third plate 422*b* connected to a second output 416*b* of the sampling unit 410. Also, the sampling unit 410 comprises a third plate switch 430*b* with a gate 432*b* configured to receive the first clock signal and a fourth plate switch 434*b* with a gate 436*b* configured to receive the second clock signal.

The first input buffer 414*a* is connected to the second input buffer 414*b* in a path to the low voltage level. Thus, the sampling unit 410 may comprise a single power gating switch associated with both the first input buffer 414*a* and the second input buffer 414*b*.

The sampling unit 410 thus comprises a shared switch 438 arranged between each of the first input buffer 414*a* and the second input buffer 414*b* and a connection to the low voltage level of the input buffers, such as ground voltage.

The shared switch 438 may be implemented by a transistor operating as a switch, wherein a signal at a gate 440 of the shared switch 438 controls whether a channel between a source and a drain is open or closed for opening or closing the switch.

The shared switch 438 is configured to receive the second clock signal at the gate 440 for controlling the shared switch 438 between an active state and an inactive state. In the active state, the shared switch 438 is closed. In the inactive state, the shared switch 438 is open. The shared switch 438 may be implemented as an NMOS transistor.

When the second clock signal is low, the shared switch 438 is open, such that power in each of the first input buffer 414*a* and the second input buffer 414*b* is cut off via the shared switch 438 to the low voltage level.

The use of a shared switch 438 instead of two different switches each dedicated to one of the input buffers 414*a*, 414*b* implies that mismatches between two different switches are avoided.

Figure 5:
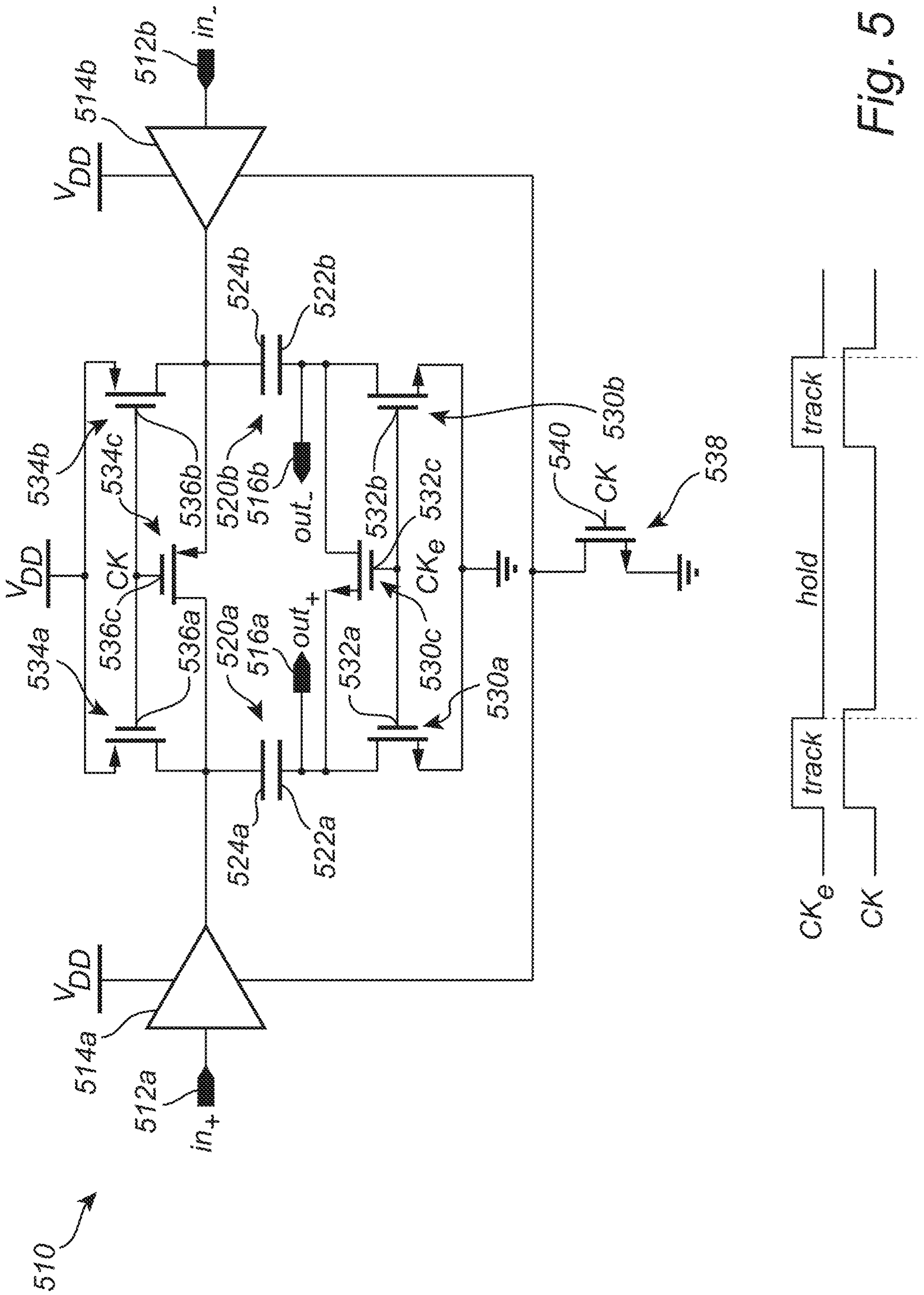
FIG. 5 is a schematic view of a sampling unit according to a fourth embodiment.

Referring now to FIG. 5, a sampling unit 510 according to a fourth embodiment will be discussed. A single sampling unit 510 is described and it should be realized that each of a plurality of sampling units may be implemented in the same manner.

The sampling unit 510 is similar to the sampling unit 410 described above and is also configured to receive a differential input signal comprising a positive input signal and a negative input signal.

Thus, the sampling unit 510 comprises a first component configured to sample the positive input signal. The first component comprises a first input 512*a* for receiving the positive input signal, a first input buffer 514*a*, a first sampling capacitor 520*a* having a first plate 522*a* and a second plate 524*a*, with the first plate 522*a* connected to a first output 516*a* of the sampling unit 510. Also, the sampling unit 510 comprises a second component configured to sample the negative input signal. The second component comprises a second input 512*b* for receiving the negative input signal, a second input buffer 514*b*, a second sampling capacitor 520*b* having a third plate 522*b* and a fourth plate 524*b*, with the third plate 522*b* connected to a second output 516*b* of the sampling unit 510.

In the embodiment shown in FIG. 5, the sampling unit 510 comprises a shared switch 538 arranged between each of the first input buffer 514*a* and the second input buffer 514*b* and a connection to the low voltage level of the input buffers, such as ground voltage. The shared switch 538 is configured to receive the second clock signal at a gate 540 for controlling the shared switch 538 between an active state and an inactive state. However, it should be realized that separate power gating switches may be used for the first input buffer 514*a* and the second input buffer 514*b*.

As shown in FIG. 5, the sampling switches may be implemented by three switches. Alternatively, or additionally, the hold switches may be implemented by three switches.

Thus, the sampling unit 510 comprises a second plate switch 534*a* with a gate 536*a* configured to receive the second clock signal and a fourth plate switch 534*b* with a gate 536*b* configured to receive the second clock signal. The sampling unit 510 further comprises a fifth switch 534*c* with a gate 536*c* configured to receive the second clock signal.

The fifth switch 534*c* may be implemented by a transistor operating as a switch, wherein a signal at the gate 536*c* of the fifth switch 534*c* controls whether a channel between a source and a drain is open or closed for opening or closing the switch.

The fifth switch 534*c* is configured to receive the second clock signal at the gate 536*c* for controlling the fifth switch 534*c* between an active state and an inactive state. In the active state, the fifth switch 534*c* is closed. In the inactive state, the fifth switch 534*c* is open.

The fifth switch 534*c* may be implemented as a same type of transistor as the second and fourth plate switches 534*a*, 534*b*. Hence, the fifth switch 534*c* may be implemented as a PMOS transistor, with a source of the fifth switch 534*c* connected to the fourth plate 524*b* of the second sampling capacitor 520*b* and a drain of the fifth switch 534*c* connected to the second plate 524*a* of the first sampling capacitor 520*a*.

Further, the sampling unit 510 comprises a first plate switch 530*a* with a gate 532*a* configured to receive the first clock signal and a third plate switch 530*b* with a gate 532*b* configured to receive the first clock signal. The sampling unit 510 further comprises a sixth switch 530*c* with a gate 532*c* configured to receive the first clock signal.

The sixth switch 530*c* may be implemented by a transistor operating as a switch, wherein a signal at the gate 532*c* of the sixth switch 530*c* controls whether a channel between a source and a drain is open or closed for opening or closing the switch.

The sixth switch 530*c* is configured to receive the first clock signal at the gate 532*c* for controlling the sixth switch 530*c* between an active state and an inactive state. In the active state, the sixth switch 530*c* is closed. In the inactive state, the sixth switch 530*c* is open.

The sixth switch 530*c* may be implemented as a same type of transistor as the first and third plate switches 530*a*, 530*b*. Hence, the sixth switch 530*c* may be implemented as an NMOS transistor, with a drain of the sixth switch 530*c* connected to the third plate 522*b* of the second sampling capacitor 520*b* and a source of the sixth switch 530*c* connected to the first plate 522*a* of the first sampling capacitor 520*a*.

The use of three switches 530*a*, 530*b*, 530*c* forming the sampling switches and/or three switches 534*a*, 534*b*, 534*c* forming the hold switches may be used for reducing differential resistance for the same load of the clock signal or for reducing the load for the same resistance.

In comparison to the third embodiment, the fifth switch 534*c* and the sixth switch 530*c* are added in the fourth embodiment. Now, we consider the second and fourth plate switches 434*a*, 434*b* of the third embodiment in comparison to the second, fourth and fifth switches 534*a*, 534*b*, 534*c* of the third embodiment. A similar comparison may be made between the first and third plate switches 430*a*, 430*b* of the third embodiment and the first, third, and sixth switches 530*a*, 530*b*, 530*c* of the fourth embodiment.

If each of the second and fourth plate switches 434*a*, 434*b* has a size of $S_1$ and a resistance of $R_1$, the total load St for each clock signal is $2*S_1$ and the total differential resistance is $2*R_1$. Since the resistance is inversely proportional to switch size, the resistance may be defined as $R_1=K/S_1$, where K is a proportionality constant. Thus, for the third embodiment, resistance $R_{emb3}$ and total load $S_{tot}$ may be defined as:

$$R_{emb3} = 2R_1 = 2 \times K/S_1 \quad (1a)$$

$$S_{tot} = 2S_1 \quad (1b)$$

For the second, fourth and fifth switches 534*a*, 534*b*, 534*c* of the fourth embodiment, the additional parallel fifth switch 534*c* may be designed for reducing the differential resistance for the same load of the clock signal. The fifth switch 534*c* may be assumed to have a size of $a*S_1$ and the two second and fourth switches 534*a*, 534*b* may have an equal size, each having a size of $(1-a/2)*S_1$. The resistance of the fifth switch 534*c* is then $R_a=K/(a*S_1)$ and the resistance of the second and fourth plate switches 534*a*, 534*b* is then $R_b=K/((1-a/2)*S_1)$.

Thus, for the fourth embodiment, resistance $R_{emb3}$ and total load $S_{tot}$ may be defined as.

$$R_{emb4} = R_a // R_b = [2/(1+3a/2)] \times K/S_1 \quad (2a)$$

$$S_{tot} = aS_1 + 2(1-a/2)S_1 = 2S_1 \quad (2b)$$

It may be seen that the equations apply to values of a between 0 and 2. Further, it may be seen from equations 1b and 2b above, that for all such values of a, the total load for the clock signal is always the same. In addition, the differential resistance in the fourth embodiment is reduced in relation to the differential resistance in the third embodiment and the resistance is increasingly reduced for a larger value of a.

The resistance of the fourth embodiment may be written as a function of the resistance of the third embodiment as:

$$R_{emb4} = \frac{R_{emb3}}{1+3a/2}.$$

For example, choosing a=2/3, each of the second, fourth and fifth switches 534*a*, 534*b*, 534*c* has the same size and the differential resistance is halved to $R_1$. Choosing a=1, the resistance is further reduced to $0.4*R_1$.

Alternatively, the additional parallel fifth switch 534*c* may be designed for reducing the load for the same resistance. Reducing the load implies that power is saved in the sampling unit 510 compared to the sampling unit 410.

The resistance of the fifth switch 534*c* may be set to equal $R_a=R_1/q$, and the resistance of the second and fourth plate switches 534*a*, 534*b* may be set to equal $R_b=R_1/(1-2q)$. This would imply that the total resistance of the fourth embodiment would be $2*R_1$, i.e. equal to the total resistance of the third embodiment.

With the resistance of fifth switch 534*c* set in this manner, the fifth switch 534*c* has a size of $Sa=q*S_1$. Further, the second and fourth plate switches 534*a*, 534*b* each have a size of $S_b=(1-2q)*S_1$. The total size of the switches for the fourth embodiment Semb4 is then defined as $S_{emb4}=S_a+2*S_b=(2-3q)*S_1$. The size of the switches of the fourth embodiment may be written as a function of the size Semb3 (see equation 1b above) of the switches of the third embodiment as:

$$S_{emb4} = \left(1 - \frac{3}{2}q\right)S_{emb3}.$$

It may be seen that the equations apply to values of q between 0 and 0.5. For example, choosing q=1/4 results in two parallel paths each having a resistance of $4*R_1$ and hence results in a total resistance of $2*R_1$, while the total size of switches is only 62.5% of the corresponding total size of switches in the third embodiment. This also implies that the load is correspondingly reduced providing a reduction in power consumption of the sampling unit 510.

Figure 6:
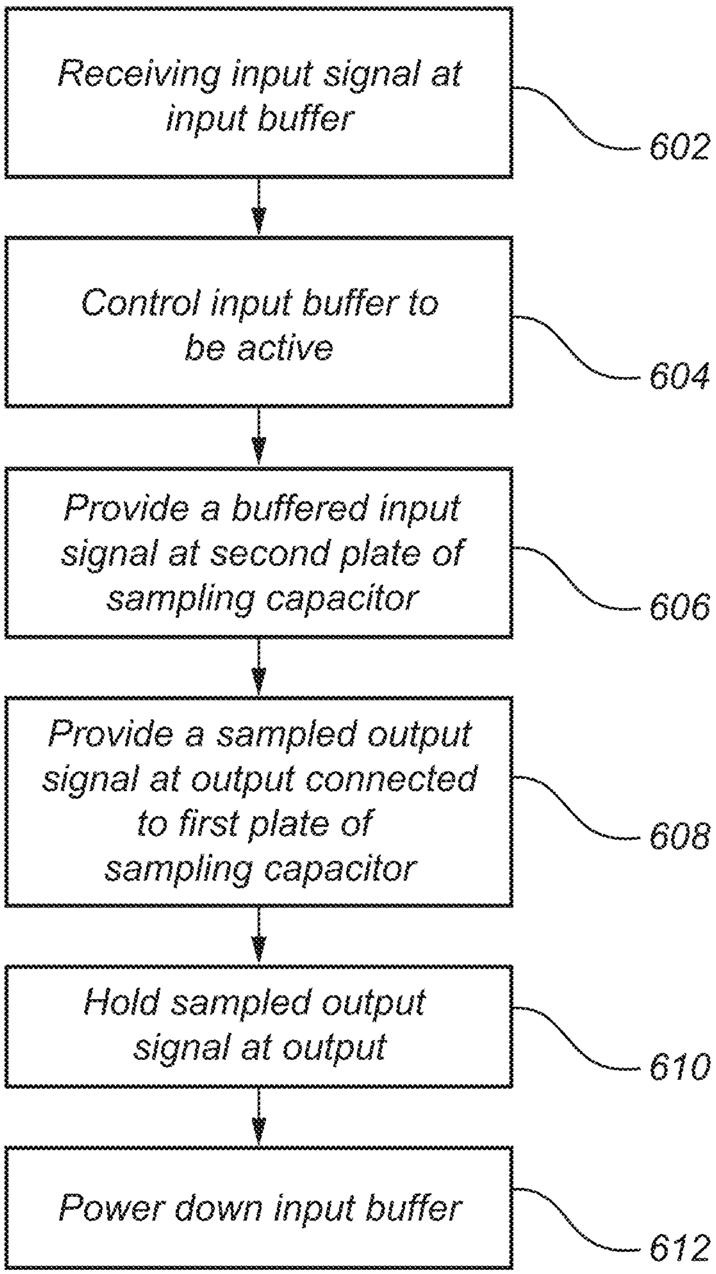
FIG. 6 is a flow chart of a method according to an embodiment.

Referring now to FIG. 6, a method for signal sampling and holding will be described. The method may comprise receiving an input signal at an input of the signal sampling circuitry and distributing the input signal to each sampling unit of a plurality of sampling units. The sampling units may be clocked for providing time-interleaved sampling of the input signal.

The method comprises steps described in the following, wherein the steps are performed by each sampling unit of the plurality of sampling units for providing and holding a sample by the sampling unit.

Thus, the method comprises receiving 602 the input signal at an input buffer. The method further comprises controlling 604 the input buffer to be active and providing 606 a buffered input signal from the input buffer at a second plate of a sampling capacitor.

The method further comprises providing 608 a sampled output signal at an output of the sampling unit connected to a first plate of the sampling capacitor, by opening a first plate switch between the first plate of the sampling capacitor and a first reference voltage. This may involve controlling the first plate switch based on a first clock signal at a gate of the first plate switch, wherein the first clock signal controls the first plate switch between an active and an inactive state. The first clock signal may control the first plate switch to assume the inactive state for opening the first plate switch.

The method further comprises holding 610 the sampled output signal at the output by closing a second plate switch between the second plate of the sample capacitor and a second reference voltage. This may involve controlling the second plate switch based on a second clock signal at a gate of the second plate switch, wherein the second clock signal controls the second plate switch between an active and an inactive state. The second clock signal may control the first plate switch to assume the inactive state for closing the second plate switch.

The first clock signal may change from track to hold state slightly before the second clock signal. The first plate switch receiving the first clock signal opens for providing a sampled output signal at the output. Thereafter, the input buffer may be disconnected from the second plate of the sampling capacitor and the second plate switch may be closed for holding the sampled value.

The method comprises powering down 612 the input buffer by controlling at least one power gating switch. The powering down of the input buffer may ensure that the input buffer is disconnected from the second plate of the sampling capacitor, without need of a switch between the output of the input buffer and the second plate of the sampling capacitor. The at least one power gating switch may also be controlled for ensuring that the input buffer is active when sampling of a value of the input signal is to be performed.

The sampled output signal is held at the output of the sampling unit allowing the sampled output signal to be provided for analog-to-digital conversion.

The powering down of the input buffer may be achieved by controlling the at least one power gating switch to assume an inactive state. This may be achieved using only the second clock signal for controlling a single power gating switch. Alternatively, the second clock signal and an additional third clock signal being an inverse of the second clock signal are used for controlling two power gating switches.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A signal sampling circuitry comprising:

a plurality of sampling units configured to receive an input signal for time-interleaved sampling, wherein each sampling unit of the plurality of sampling units comprises:

a sampling capacitor having a first plate and a second plate, wherein the first plate is connected to an output of the sampling unit;

a first plate switch arranged between the first plate of the sampling capacitor and a first reference voltage, wherein the first plate switch is configured to receive a first clock signal at a gate of the first plate switch for controlling the first plate switch between an active state and an inactive state;

a second plate switch arranged between the second plate of the sampling capacitor and a second reference voltage, wherein the second plate switch is configured to receive a second clock signal at a gate of the second plate switch for controlling the second plate switch between an active state and an inactive state;

an input buffer configured to receive the input signal and configured to output a buffered input signal at an output node, wherein the output node of the input buffer is connected to the second plate of the sampling capacitor;

wherein the input buffer is connected to at least one power gating switch for powering down the input buffer, wherein the at least one power gating switch comprises an interrupt switch arranged between a connection to a low voltage level and a connection to a high voltage level of the input buffer, wherein the interrupt switch is configured to receive the second clock signal at a gate of the interrupt switch for controlling the interrupt switch between an active state and an inactive state, and wherein the interrupt switch is a first interrupt switch arranged between the input buffer and ground and wherein the at least one power gating switch further comprises a second interrupt switch arranged between the input buffer and the high voltage level, wherein the second interrupt switch is configured to receive a third clock signal at a gate of the second interrupt switch for controlling the second interrupt switch between an active state and an inactive state, wherein the third clock signal is an inverse of the second clock signal.

2. The signal sampling circuitry according to claim 1, wherein different sampling units are configured to receive different clock signals that are phase-shifted in relation to each other.

3. The signal sampling circuitry according to claim 1 further comprising a distribution network for distributing the input signal to each of the sampling units.

4. The signal sampling circuitry according to claim 1, wherein the first reference voltage is a ground voltage.

5. A method for signal sampling and holding using the plurality of sampling units according to claim 1, said method comprising, by each sampling unit of the plurality of sampling units:

receiving the input signal at the input buffer;

controlling the input buffer to be active;

providing the buffered input signal from the input buffer at the second plate of the sampling capacitor;

providing a sampled output signal at the output of the sampling unit connected to the first plate of the sampling capacitor, by opening the first plate switch between the first plate of the sampling capacitor and the first reference voltage;

thereafter holding the sampled output signal at the output by closing the second plate switch between the second plate of the sample capacitor and the second reference voltage; and powering down the input buffer by controlling at least one power gating switch.

6. The method according to claim 5, wherein the method further comprises, by each sampling unit of the plurality of sampling units, receiving the first clock signal and the second clock signal for controlling the first plate switch and the second plate switch, wherein different sampling units receive different clock signals that are phase-shifted in relation to each other.

7. A signal sampling circuitry comprising:

a plurality of sampling units configured to receive an input signal for time-interleaved sampling, wherein each sampling unit of the plurality of sampling units comprises:

a sampling capacitor having a first plate and a second plate, wherein the first plate is connected to an output of the sampling unit;

a first plate switch arranged between the first plate of the sampling capacitor and a first reference voltage, wherein the first plate switch is configured to receive a first clock signal at a gate of the first plate switch for controlling the first plate switch between an active state and an inactive state;

a second plate switch arranged between the second plate of the sampling capacitor and a second reference voltage, wherein the second plate switch is configured to receive a second clock signal at a gate of the second plate switch for controlling the second plate switch between an active state and an inactive state;

an input buffer configured to receive the input signal and configured to output a buffered input signal at an output node, wherein the output node of the input buffer is connected to the second plate of the sampling capacitor;

wherein the input buffer is connected to at least one power gating switch for powering down the input buffer;

wherein the input signal is a differential input signal comprising a positive input signal and a negative input signal, and wherein, for each sampling unit, the sampling capacitor is a first sampling capacitor, the first plate switch is connected to a first output of the sampling unit, and the input buffer is a first input buffer, wherein the first input buffer is configured to receive the positive input signal and configured to output a buffered positive input signal at the second plate of the first sampling capacitor, and wherein each sampling unit further comprises:

a second sampling capacitor having a third plate and a fourth plate, wherein the third plate is connected to a second output of the sampling unit;

a third plate switch arranged between the third plate of the second sampling capacitor and the first reference voltage, wherein the third plate switch is configured to receive the first clock signal at a gate of the third plate switch for controlling the third plate switch between an active state and an inactive state;

a fourth plate switch arranged between the fourth plate of the second sampling capacitor and the second reference voltage, wherein the fourth plate switch is configured to receive the second clock signal at a gate of the fourth plate switch for controlling the fourth plate switch between an active state and an inactive state;

a second input buffer configured to receive the negative input signal and configured to output a buffered negative input signal at a second output node, wherein the second output node of the second input buffer is connected to the fourth plate of the second sampling capacitor;

wherein the first input buffer is connected to the second input buffer via the at least one power gating switch which comprises a shared switch for powering down the first and second input buffers.

8. The signal sampling circuitry according to claim 7, wherein a ground connection of the first input buffer is connected to a ground connection of the second input buffer and wherein the shared switch is arranged between ground and the first and second input buffers.

9. The signal sampling circuitry according to claim 8, wherein each sampling unit further comprises a fifth switch arranged between the second plate of the first sampling capacitor and the fourth plate of the second sampling capacitor, wherein the fifth switch is configured to receive the second clock signal at a gate of the fifth switch for controlling the fifth switch between an active state and an inactive state.

10. The signal sampling circuitry according to claim 9, wherein each sampling unit further comprises a sixth switch arranged between the first plate of the first sampling capacitor and the third plate of the second sampling capacitor, wherein the sixth switch is configured to receive the first clock signal at a gate of the sixth switch for controlling the sixth switch between an active state and an inactive state.

11. The signal sampling circuitry according to claim 10, wherein the first and third plate switches have an equal size related to a size of the sixth switch.

12. The signal sampling circuitry according to claim 9, wherein the second and fourth plate switches have an equal size related to a size of the fifth switch.

13. The signal sampling circuitry according to claim 7, wherein different sampling units are configured to receive different clock signals that are phase-shifted in relation to each other.

14. The signal sampling circuitry according to claim 7, wherein each sampling unit further comprises a sixth switch arranged between the first plate of the first sampling capacitor and the third plate of the second sampling capacitor, wherein the sixth switch is configured to receive the first clock signal at a gate of the sixth switch for controlling the sixth switch between an active state and an inactive state.

15. The signal sampling circuitry according to claim 7, wherein each sampling unit further comprises a fifth switch arranged between the second plate of the first sampling capacitor and the fourth plate of the second sampling capacitor, wherein the fifth switch is configured to receive the second clock signal at a gate of the fifth switch for controlling the fifth switch between an active state and an inactive state.

* * * * *